Figure 3:
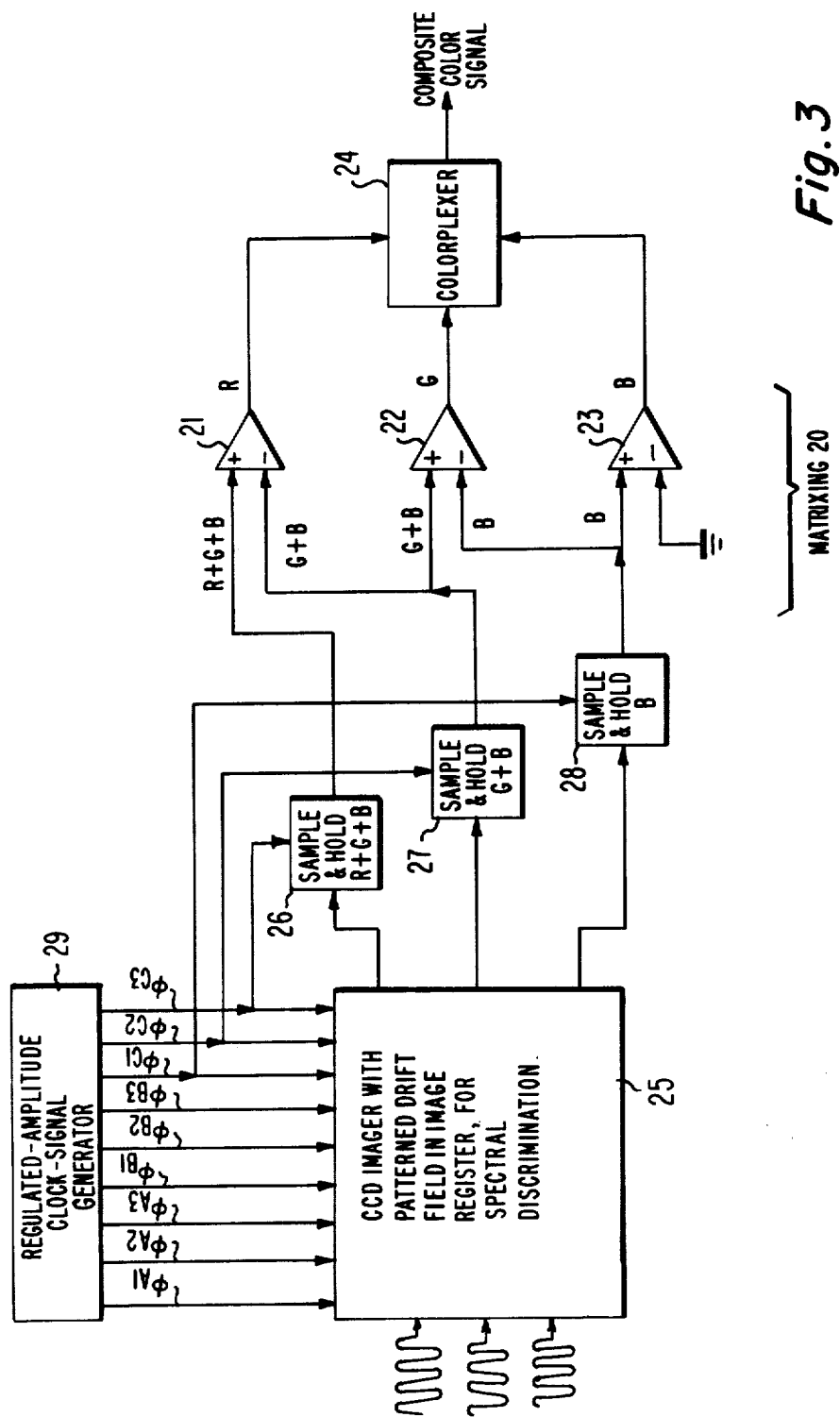

United States Patent [19]

Jastrzebski et al.

[11] Patent Number: 4,481,522

[45] Date of Patent: Nov. 6, 1984

[54] CCD IMAGERS WITH SUBSTRATES HAVING DRIFT FIELD

[75] Inventors: Lubomir L. Jastrzebski, Plainsboro; Peter A. Levine, Trenton, both of N.J.

[73] Assignee: RCA Corporation, New York, N.Y.

[21] Appl. No.: 361,228

[22] Filed: Mar. 24, 1982

[51] Int. Cl.³ .................... H01L 29/78; H01L 27/14; H01L 31/00; H04N 9/07

[52] U.S. Cl. ........................................ 357/24; 357/30; 358/44

[58] Field of Search ................ 357/24 LR, 30; 358/44

[56] References Cited

U.S. PATENT DOCUMENTS

| | | | |
|---|---|---|---|
| 3,860,956 | 1/1975 | Kubo et al. | 358/44 |
| 4,001,878 | 1/1977 | Weimer | 357/24 LR |
| 4,155,094 | 5/1979 | Ohba et al. | 357/24 LR |
| 4,160,985 | 7/1979 | Kamins et al. | 357/30 |
| 4,210,922 | 7/1980 | Shannon | 357/24 |
| 4,229,754 | 10/1980 | French | 357/30 |
| 4,242,694 | 12/1980 | Koike et al. | 357/24 LR |
| 4,247,862 | 1/1981 | Klein | 357/24 LR |
| 4,282,547 | 8/1981 | Morishita | 358/44 |
| 4,348,690 | 9/1982 | Jastrzebski et al. | 357/24 LR |

*Primary Examiner*—Gene M. Munson
*Attorney, Agent, or Firm*—Joseph S. Tripoli; George E. Haas; Allen LeRoy Limberg

[57] ABSTRACT

A CCD imager is made to have an internal drift field tending to force further into the bulk any charge carriers outside the potential wells induced adjacent to integrating electrodes, so those charge carriers recombine in the bulk. This reduces background striations, reduces crosstalk, can be used for improving blooming control, and can be exploited to control the wavelengths of light to which the imager is responsive.

16 Claims, 6 Drawing Figures

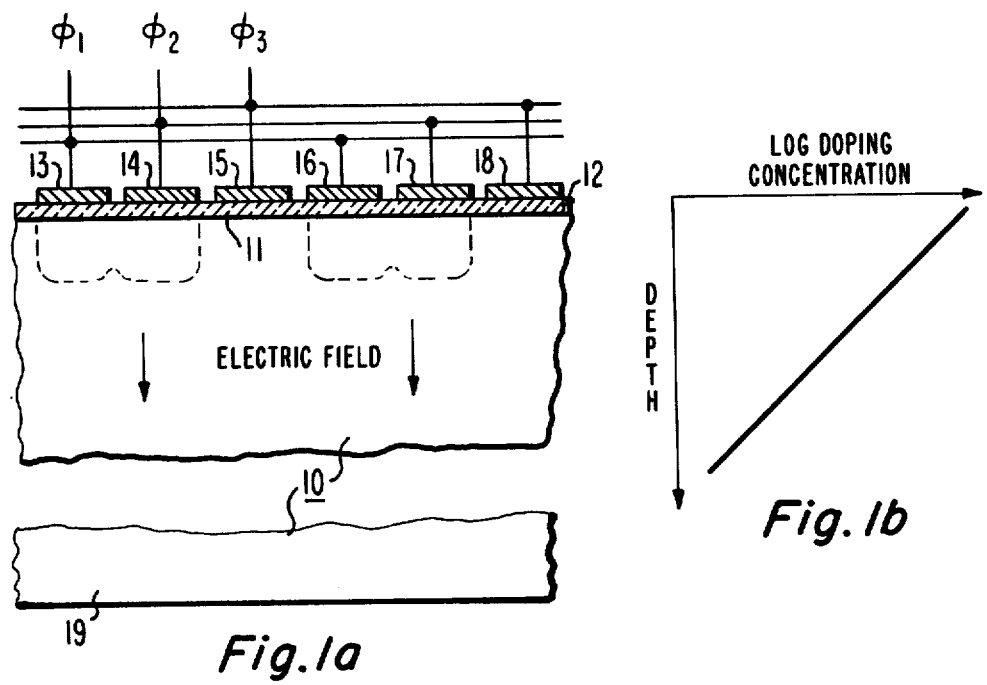
Fig. 1a
Fig. 1b
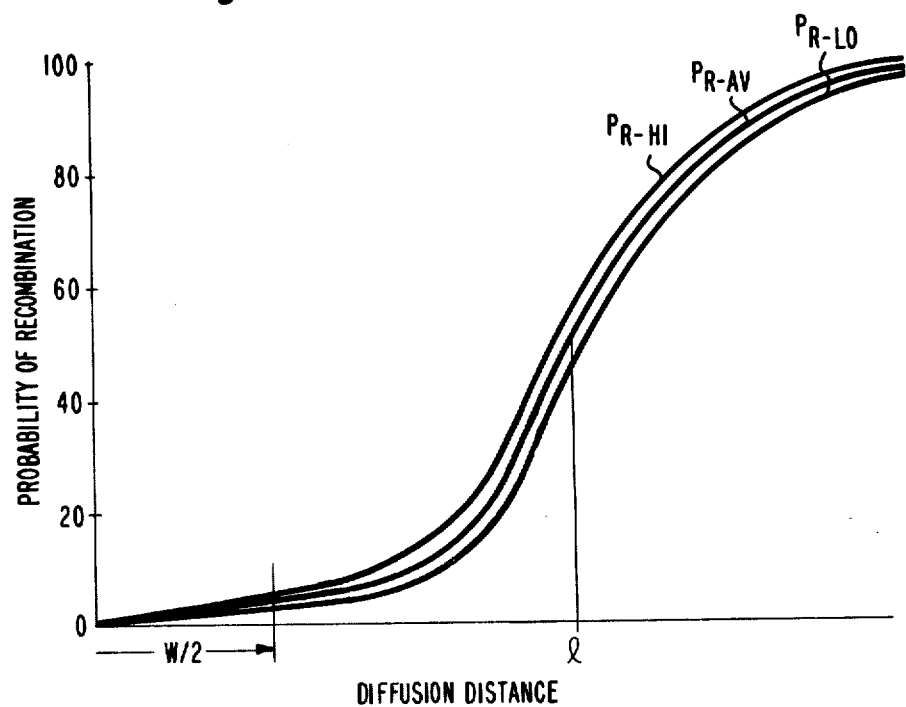
Fig. 2

CCD IMAGERS WITH SUBSTRATES HAVING DRIFT FIELD

The invention concerns charge-coupled device (CCD) imagers and, more particularly, ones having drift fields in their semiconductive substrates to improve the operation of the CCD.

Charge-coupled imagers may be constructed using either surface or buried charge transfer channels. The better transfer efficiency of buried charge transfer channel imagers allows them to provide better image resolution than imagers having surface charge transfer channels can. However, imagers with buried charge transfer channels tend to be more costly to construct because of the additional processing steps needed to obtain buried channel operation with anti-blooming control. The invention to be described, is particularly well-adapted to solving problems associated with surface channel imagers operated in the so called anti-blooming mode, but is also applicable to suppressing cross-talk on buried channel imagers. Suppression of cross-talk between charge transfer channels is of particular interest when they are arranged to respond to different wavelengths of light, since such cross-talk gives rise to undesirable cross-color phenomena easily discerned in a television display generated from video samples from the CCD imager. In the present application, the invention is described with particular regard to surface channel CCD imagers.

A basic problem in such CCD imagers is the appearance of so-called striation patterns in the background of the detected television image. L. Jastrzebski, P. A. Levine, A. D. Cope, W. N. Henry and D. F. Battson discuss the origins of these striations in their paper "Material Limitations which Cause Striations in CCD Imagers" appearing pp. 1694–1701 of *IEEE TRANSACTIONS ON ELECTRON DEVICES*, Vol. ED-27, NO. 8, Aug. 1980. In surface channel CCD imagers operated in the anti-blooming accumulation mode, some part of the background striations is attributable to variations in the resistivity of the semiconductor material in which the charge transfer channels are induced. The resistivity variations give rise to electric field intensity variations in the semiconductor with components parallel to the surface along which charge is transferred, which components alternately aid and hinder charge transfer to give rise to background striations.

The predominating cause of background striations in surface channel imagers is the non-uniformity of the density of charge recombination centers in the bulk—i.e., those portions of the semiconductive substrate outside the depletion regions induced in the semiconductive substrate adjacent to the gate electrodes of the CCD. (Regions depleted of electrons are induced by relatively positive potentials applied to the gate electrodes adjoining a p-type semiconductive material in which electrons are minority carriers. Analogous phenomena to those described take place when regions are depleted of holes induced by relatively negative potentials being applied to gate electrodes adjoining an n-type semiconductive material in which holes are minority carriers.) In the depletion regions the Fermi level is sufficiently shifted to make majority charge carriers unavailable for recombination with the minority charge carriers, which have been generated by photoconversion of radiant energy in the image projected into the semiconductor. Majority carriers are available for recombination in the bulk, however, and minority carriers can recombine with them at recombination centers associated with irregularities in the crystalline lattice structure of the semiconductive material. The charge carriers generated in the bulk by photoconversion diffuse, since the imager is operated at temperatures above zero Kelvin.

In prior art CCD imagers this thermal diffusion is sufficiently random in direction that an appreciable number of the charge carriers diffuse from the bulk towards the depletion regions induced under the gate electrodes. The fraction of these charge carriers which reach the depletion regions varies, according to the probability of their being recombined in the bulk instead. Decreased density of charge recombination centers in portions of the bulk with lesser density of lattice irregularities increases the likelihood of charge carriers reaching nearby depletion regions, causing greater collection of charge carriers in those depletion regions and leading to relative brightness in the pixels supplied in response to integrated charge accumulated from those depletion regions.

The invention, in one of its aspects, is directed to suppressing these sources of background striations, described in the preceding paragraph, by preventing all or nearly all of the charge carriers generated in the bulk from reaching the depletion regions induced under the gate electrodes. This is done by creating a field, such as a drift field, in the semiconductor substrate to sweep minority charge carriers generated in the bulk further into the bulk, away from the electrode-bearing surface of the substrate, there to recombine with majority carriers. This reduces the likelihood of charge carriers generated closest to one CCD register gate electrode diffusing to a depletion region under another gate electrode to cause various cross-talk phenomena, as will be described in the detailed description that follows, as well as suppressing background striations. A drift field can be generated by grading the concentration of doping impurities in the semiconductor substrate such that the concentration decreases with increasing distance from the surface which the charge transfer channels of the CCD shift registers adjoin.

Figure 4:
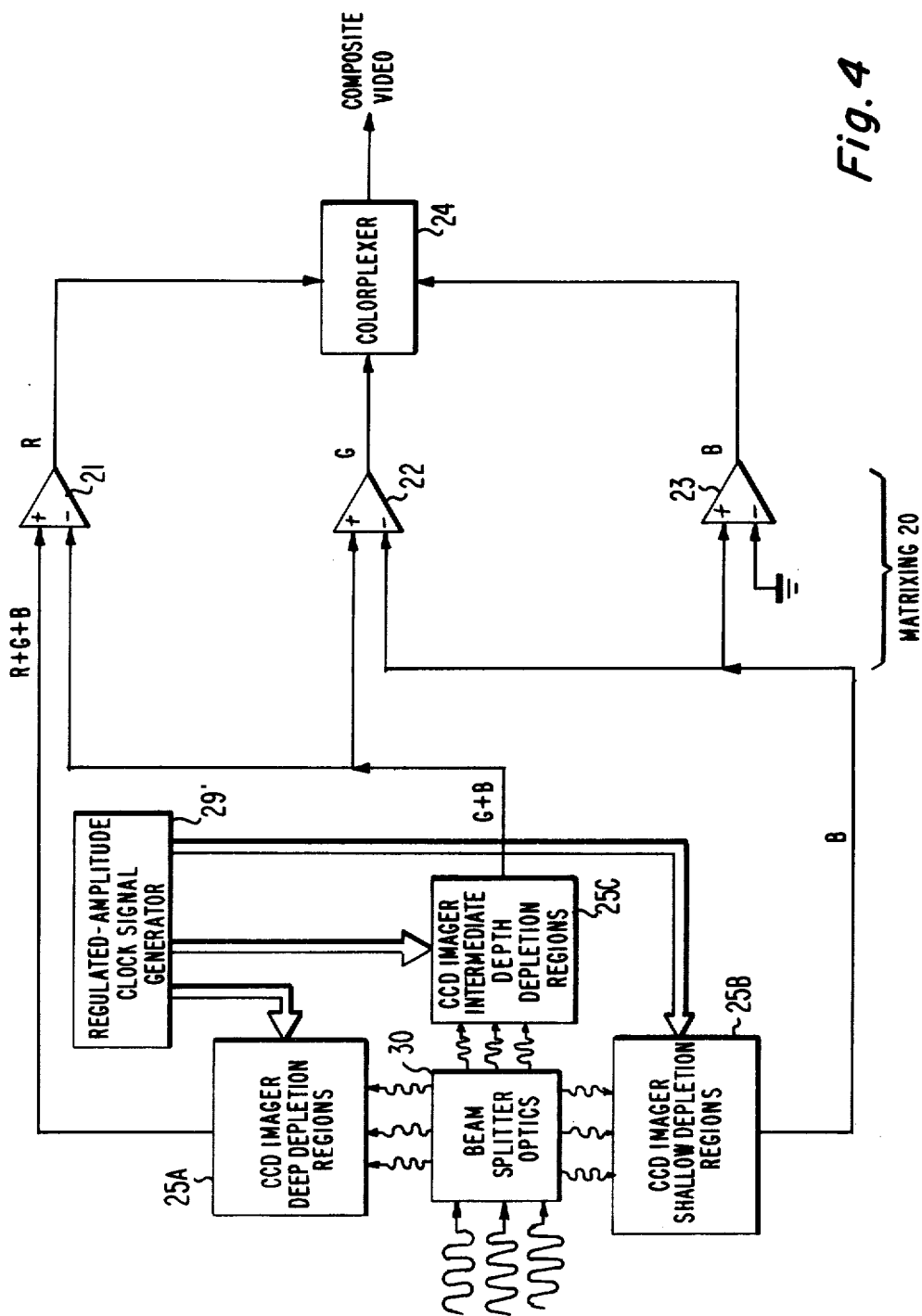
Figure 5:
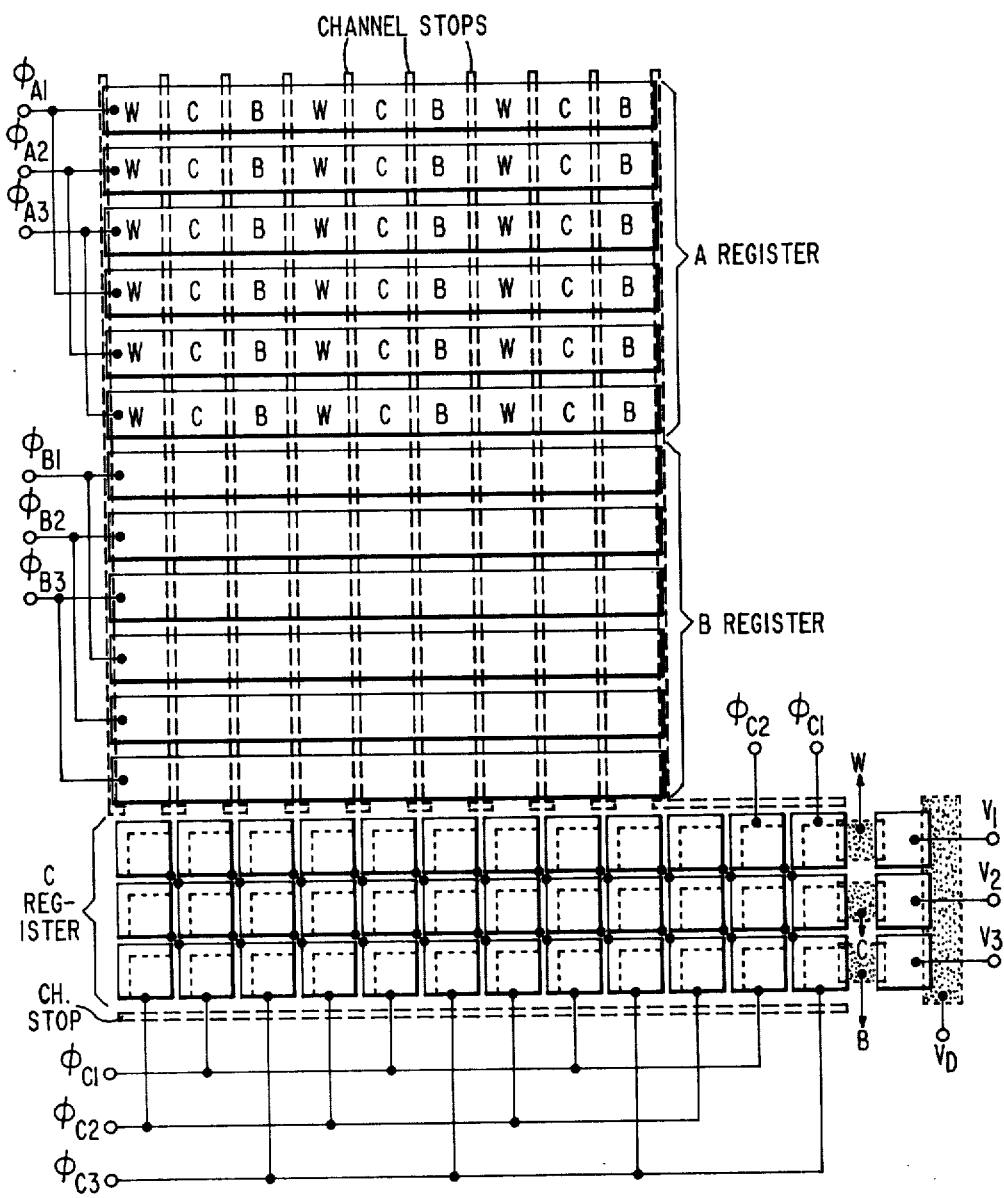

In the drawing:

FIGS. 1a and 1b, drawn to a common exaggerated vertical scale, are a profile view of a portion of a CCD imager image register and a plot of the doping concentration in such an image register constructed in accordance with the invention;

FIG. 2 is a graph of the probability of recombination of minority charge carriers in a semiconductive solid versus their diffusion distance d plotted on a roughly ln(d/l) scale, where l is the mean diffusion distance;

FIGS. 3 and 4 are block diagrams of alternative color camera arrangements using CCD imagers in accordance with the invention, which figures omit the conventional zoom and relay lens portions of the cameras used to project images into the CCD imagers; and FIG. 5 is a plan view of a respresentative CCD imager constructed according to the invention for use in a color camera arrangement of the sort shown in FIG. 2.

FIG. 1a shows the profile of a portion of one charge transfer channel in a three-phase CCD imager image, or A, register. The substrate, 10 of semiconductive material has a first surface 11 adjoined by a dielectric layer 12. (For clarity, sectioning lines are omitted on the cut through substrate 10.) Where the substrate 10 is silicon, dielectric layer 12 may be silicon dioxide formed from an oxidizing atmosphere, for example. Atop dielectric layer 12 are electrodes 13–18, which may be metallic electrodes formed by selective etching from a film deposited by evaporation or sputtering. Or the electrodes may be polysilicon, supposing the substrate to be silicon and the dielectric layer to be silicon dioxide. (Referring to the first plane surface 11 of the substrate 10, atop which the electrodes 13–18 are deposed, as its "top" surface and referring to an opposed second plane surface 19 of the substrate 10 as its "bottom" surface is a convention adopted for facilitating description of the processes used to manufacture the CCD imager. The orientation of the charge coupled device in physical space may be otherwise. As utilized in a television camera the top and bottom surfaces of the CCD imager are conventionally referred to as its "front" side and "back" side, respectively, particularly in connection with specifying which of these surfaces is illuminated by the light image.)

Electrodes 13 and 16 are shown connected to receive a first phase $\phi_1$ of the three-phase clocking signals; electrodes 14 and 17, to receive a second phase $\phi_2$ of those signals; and electrodes 15 and 18, to receive a third phase $\phi_3$ of those signals. The successive application of the clocking signals $\phi_1$, $\phi_2$, and $\phi_3$ in order of their ordinal number subscripts will, as known, cause shift of charge packets in potential wells induced under the electrodes in a rightward direction on each clocking signal transition. These potential wells are associated with the charge depletion regions induced below the electrodes receiving relatively positive clocking signal phases. In FIG. 1 the depletion regions are shown in dashed outline being induced under electrode pairs 13, 14 and 16, 17 presumed to be receiving $\phi_1$, $\phi_2$ clock voltages relatively positive to the $\phi_3$ clock voltage applied to electrodes 15 and 18.

The shift register is assumed to be one of a plurality of column or row registers that are components of the complete image register of the optical imager. So shift register operation takes place only during recurrent transfer intervals when the $\phi_3$, $\phi_1$, $\phi_2$ phases are cyclically clocked "low" or relatively negative relative to the other two. These transfer intervals are interspersed with charge integration intervals when clocking is halted to leave two of the clock phases "high" or relatively positive relative to the other. $\phi_1$, $\phi_2$ will be assumed to be the high clock phases in the field of video samples being generated. Where field interlacing is used to increase vertical resolution, the phases selected to be high during charge integration intervals will change from field to field, assuming the CCD imager to be a vertical-field-transfer type.

During each charge integration interval a radiant energy image (which may be in the visible light spectrum supposing the CCD imager detecting elements to be silicon) is projected into the substrate 10 through its top surface 11 or its bottom surface 19. This energy interacts with the substrate 10 to generate charge carriers in the stratum next to dielectric layer 12. The minority charge carriers that are to be collected as image samples are electrons in the case where the substrate 10 has p-type doping. Charge depletion regions induced under selected ones of the electrodes 13–18 usually extend only part way into the stratum of substrate 10 next to surface 12. Charge carriers generated in charge depletion regions are retained in these regions, owing to the potential wells associated with those regions. Other charge carriers generated in the bulk portions of the region will migrate to the charge depletion regions, owing to normal diffusion processes in a semiconductor substrate operated at temperature above zero Kelvin. These charge carriers collected in the depletion regions form, in aggregate, the charge packets which transfer to right during transfer intervals. The CCD imager with three-phase clocking during charge transfer intervals is representative of a class of CCD imagers which may differ from it in using uni-phase, two-phase, four-phase, and other multi-phase clocking schemes; the mode of clocking is incidental to the invention, which is applicable to any of these CCD imagers.

A problem in prior art imagers of this class is associated with the carriers generated in the bulk of the substrate 10 migrating through the substrate lattice to add to charge carriers generated in the depletion regions themselves, to augment the charge packets transferred to right during transfer intervals. This, as described at length above, gives rise to background striations owing to the non-uniform concentration of charge recombination centers in the substrate 10 bulk. The more remote from the depletion regions the site where a charge carrier is generated is, the more likely the carrier is to diffuse to a region other than the one closest to its generation site. However, the number of charge carriers generated in the substrate 10 decreases further into the substrate 10 from the surface through which the image is projected. So, in a CCD imager receiving an image through the top surface 11 most of the background striations will be caused by charge carriers generated in regions between the depletion regions. Charge carriers generated in the middle portions of these regions between depletion regions will be most likely to experience varying rate of recombination and will be primarily responsible for background striations. In a thinned-substrate CCD imager receiving an image through its bottom surface 19, the charge carriers generated at depths from top surface 11 greater than that over which the depletion regions extend will have a greater effect on the generation of unwanted backgound striations. No matter which of its top and bottom surfaces a CCD imager receives radiant energy from the image through, the charge carriers generated at depths from top surface 11, greater than the channel stops extend, will give rise to some cross-talk between adjacent charge transfer channels.

CCD imagers are often used after optical filters that provide color selection of the image in patterns. In such CCD imagers certain of the cross-talk phenomena described in the preceding paragraph will give rise to undesirable cross-color in a television display originating from video samples generated by the CCD imager. Some of the charge carriers generated in the bulk in response to wavelengths of light selected by the color filter, will diffuse to depletion regions that are not the closest depletion regions to their respective generation sites. Charge packets in these non-closest regions are properly associated with an adjacent color in the color filter, so undesirable cross-color conditions develop.

For example, a CCD imager may be used in conjunction with a color-stripe filter having its stripes in registration with the charge transfer channels in the image, or A, register. Cross-talk between the charge transfer channels will often give rise to cross-color. A CCD imager may be used in conjunction with a color stripe filter perpendicular to the charge transfer channels in the image register if the resulting color samples are subsequently commutated at correct spatial frequency.

Cross-talk along the length of the charge transfer channels in the image and transfer registers will then give rise to cross-color. If the color filter is of checkerboard pattern both types of cross-color will arise.

These background striation and cross-talk problems are surmounted by constructing CCD shift registers, as exemplified by the FIG. 1a structural segment, in accordance with the present invention, so that there is an electric field normal to the surface 11 that tends to force carriers deeper into the bulk away from the depletion regions induced adjacent to surface 11. This electric field can be a drift field created by a graded concentration of doping in the substrate. In the FIG. 1a structural segment the gradient of doping concentration would be normal, or perpendicular, to the surface 11 of substrate 10, with the doping concentration decreasing with depth from surface 11. The drift field is accordingly directed to force most of the charge carriers generated outside a depletion region deep into the substrate 10 bulk. In these portions of the bulk remote from surface 11 of substrate 10 the charge carriers recombine. Arrangements can also be made to place deep drain structures to dispose of the charge carriers driven into these remote portions of the bulk.

FIG. 1b is a graph of the logarithm of doping concentration versus depth into the first plane surface 11 of substrate 10 as will result in a uniform drift field. To prevent carrier diffusion over a given vertical distance of arbitrarily small value y normal to the first plane surface 11 of substrate 10, the doping concentration should change over distance y by a factor of at least e, the base of natural logarithms. That is, in excess of 2.7 times. This estimate is obtained by choosing the strength E of the electric field gradient to be such that the time $t_E$ for a charge carrier to tend to drift a distance y downward into the bulk owing to the drift field is less than the time $t_D$ for a charge carrier to tend to diffuse upward the same distance.

The time $t_D$ for a charge carrier to diffuse a distance y is approximated by equation (1), following:

$$t_D = y^2/D. \tag{1}$$

$$D = (kT/q)\mu. \tag{2}$$

In equation (2),
k is Boltzmann's constant,
T is the absolute temperature of the semiconductor,
q is the unit electron charge, and
$\mu$ is the mobility of the minority charge carrier (electron or hole) of concern.

The time $t_E$ for a charge carrier to drift a distance y owing to the action of an electric drift field gradient of strength E is given by equation 3, following.

$$t_E = y/\mu E. \tag{3}$$

E is determined, as follows, preceeding from inequality (4).

$$t_D > t_E. \tag{4}$$

Substitution is made into inequality (4) from equations (1) and (3).

$$y^2/D > y/\mu E. \tag{5}$$

Multiplying both sides of the inequality by the common factor $DE/y^2$ results in inequality (6), following.

$$E > D/\mu y \tag{6}$$

The value of D per equation (3) substituted into inequality (6) results in inequality (7), following, after elimination of $\mu$.

$$E > kT/qy \tag{7}$$

The average strength of electric field gradient between two points in a semiconductor with respective doping contentrations $N_1$ and $N_2$ can, if they are closeby each other, be satisfactorily approximated per the following equation.

$$E = (kT/qy) \ln (N_1/N_2) \tag{8}$$

To satisfy inequality (7), then, by substitution from equation (8), the conditions on change in doping concentration can be found to be as follows.

$$\ln (N_1/N_2) > 1. \tag{9}$$

$$\therefore N_1/N_2 > e. \tag{10}$$

Estimation of the distance y is the remaining thing to do in order to determine the doping gradient required to establish a drift field of the desired strength.

Consider the choice of y insofar as reducing the visibility of striation patterns in front-side illuminated CCD imagers is concerned. The vertical scale of FIG. 1a, as has been noted, is substantially expanded as compared to its horizontal scale. The depletion regions under "high" gate electrodes usually have depths in the range of 750 nm to 5 $\mu$m, while the breadth of spacing under the "low" electrodes between these depletion regions is of the order of 20 $\mu$m. The channel stops separating adjacent charge transfer channels are about 5 $\mu$m wide. The diffusion length for charge carriers is normally much longer, 100 $\mu$m or so, and varies inversely as the concentration of recombination center in the semiconductor material of the substrate 10.

FIG. 2 is a sketch graphing the probability of recombination of a charge carrier as ordinate versus its diffusion distance as abscissa. Although thermal diffusion of a charge carrier in a semiconductive solid is random in direction at any particular time, so the actual path taken by the carier is irregular, the diffusion distance is expressed in straight-line terms between the point the charge originates and a point at which the charge is at some point later in time. The diffusion distance, d, is plotted on a scale that is increasingly non-linear with increasing diffusion distance. The abscissa is roughly ln (d/l) d, which makes the scale roughly linear up to half the 20 $\mu$m gate length and roughly logarithmic through the region of mean diffusion length l. The mean diffusion length l is that diffusion distance which would be associated with 1/e probably of recombination in an ideal semiconductive material having uniform average density of recombination centers, such that the probability of recombination would be an average $P_{R-AV}$. In a substrate of actual semiconductive material probability of recombination may range between $P_{R-LO}$ and $P_{R-HI}$ in various portions of the substrate.

As pointed out previously, most of the charge carriers responsible for visible striation patterns in a CCD imager illuminated through top surface 11 originate close to that surface between depletion regions. This is particularly so if the depletion regions extend deeper into the substrate to depths beyond which few photons penetrate the substrate. There is less photoelectric generation of charge carriers in the channel stops than in the charge transfer channels—that is quantum efficiency is lower. Further, the channel stops have much smaller area adjacent to the illuminated surface than the charge transfer channels do. The means the spacings between depletion regions in the same charge transfer channel are particularly of interest insofar as striation pattern generation is concerned. The fringing fields surrounding potential "wells" associated with the depletion regions flanking such a spacing tend to make charge carriers migrate towards the closer of the two depletion regions, this tendency being stronger the closer the charge carrier is to that depletion region. So most of the charge carriers collected in a depletion region which are not intially generated in the depletion region come from no more than half w, w being the distance between depletion regions in the same charge transfer channel—i.e., half a gate electrode length where the imager is operated with only one clock phase low during charge integration intervals.

Looking at FIG. 2, one notes that the probability of recombination within such distances, 10 µm or so, is low where diffusion lengths are an order of magnitude larger, 100 µm or so. The portion of the charge carrier population generated in the spacings between depletion regions is at small diffusion distances from the depletion regions. Where $P_{R-LO}$, $P_{R-AV}$ and $P_{R-HI}$ are converging to zero as the diffusion distance, d, approaches zero. This means that the range of variation in probability of recombination of a charge carrier before its collection in a depletion region decreases as distance of the site of its generation from the depletion region decreases. That is, the contribution to background striation of charge carriers generated at sites various distances from a depletion region increases with distance. The charge carriers generated near the middle of the spacings between depletion regions are chiefly responsible for the background striations, the charge carriers generated closer to the depletion regions contribute much less to background striations.

So, then, suppose y is chosen smaller than w/2. The rate of diffusion owing to the semiconductive substrate being above zero Kelvin is essentially uniform in all directions. So, charge carriers more than distance y from the depletion region will be, no matter what straight-line direction they tend to diffuse in overtime $t_D$, forced away from surface 11 deeper into substrate 10 than the depletion regions extend, before they can be collected by the nearest depletion region. These charge carriers are [1−(2y/w)]·100 percent of the charge carriers generated in the space between the depletion regions. They will comprise 50% of the charge carriers generated between the depletion regions if Y=w/4; 75% if y=w/8 and 87.5% if y=w/16. And, as noted above, these charge carriers swept into the bulk are the ones chiefly responsible for background striations.

Half of the remaining charge carriers to be considered diffuse in straight-line directions away from the closest depletion region and will be swept deep into the substrate by the drift field, not to be collected in a depletion region. Of the remaining charge carriers, still others have diffusion directions that have such relatively small components parallel to surface 11, as compared to components perpendicular to that surface, so they too will be swept deeper into the substrate to recombine before they can diffuse to a depletion region. Some portion of the remaining charge cariers to be considered are generated far enough away from the surface 11 that even though the straight-line direction of their diffusion has a component towards the depletion region they are swept far away from surface 11 before they can be collected in a depletion region. This effect becomes significant as y is reduced to dimensions comparable to depletion region depth and becomes increasingly more significant as y is further reduced to be smaller than that depth. Owing to the convergence of $P_{R-LO}$ and $P_{R-HI}$ limits on probability of recombination, there is substantially less variation in the percentage of the remaining charge carriers collected in depletion regions than there would be in charge carriers from closer to the center of the spacing between depletion regions, swept into the bulk to recombine in the CCD imager with drift field. Thus, choosing y to be some not too large fraction of half the spacing between depletion regions will reduce background striations appreciably in a front-side illumination CCD imager.

Consider now the choice of y from the point of view of preventing cross-talk that can give rise to cross-color. Cross-talk arises in front-side illuminated CCD imagers from charge carriers generated further from surface 11 than the depletion regions extend. Any value of y small enough to suppress background striations will prevent cross-talk between successive stages in a charge transfer channel. The primary source of cross-talk to be considered, then, is between depletion regions abreast each other in adjoining charge transfer channels. This cross-talk causes undesirable cross-color where the adjacent charge transfer channels are made to respond to different portions of the light spectrum. The drift field, then, should be sufficiently strong that charge carriers cannot migrate across some fraction—say, half—the distance between these abreast depletion regions. Making y this fraction of this distance will accomplish this.

All in all, y's of about 1 µm are sufficiently small to significantly reduce background striations and cross-talk that can give rise to cross-color in CCD imagers of the dimensions described. This is true in back-side illuminated CCD imagers as well, where background striations as well as channel-to-channel cross-talk originate from charge carriers generated further from surface 11 than the depletion regions extend. Making y smaller than necessary results in reduction in the number of charqe carriers collected in the depletion regions, which will reduce imager sensitivity.

The drift field for sweeping charge carriers outside the depletion regions into the bulk to recombine, can improve anti-blooming for a surface-channel CCD imager operated in the accumulation mode of anti-blooming. Blooming is the condition where charge carriers generated in the depletion regions responsive to intense illumination fill those depletion regions and the excess carriers spil out of those depletion regions to other less intensely illuminated depletion regions in the CCD imager. The drift field pushes substantial portions of the spilled over charge carriers into the bulk to recombine, rather than permitting them to reach other depletion regions.

A CCD imager of the vertical-field-transfer type embodying the present invention has been built using a standard thick-oxide p-MOS process to make the surface-channel charge transfer channels of its A and B registers. The starting wafer was 100-oriented silicon uniformly doped with p-type atoms (more particularly, boron) in a concentration of about $1.4 \cdot 10^{14}$ atoms/cm$^3$. Prior to the steps of the standard thick-oxide p-MOS process the drift field normal to the top surface of the wafer was created by ion implantation of further p-type atoms. A dose of about $1 \cdot 10^{12}$ atoms/cm$^2$ with implantation energy between 150 and 200 keV was followed by 72 hour heating of the wafer at 1100° C. in an inert atmosphere. Subsequent to this period of heating to diffuse the dose into the substrate provided by the wafer, slow cooling was permitted. (This wafer preparation technique also reduces background striations attributable to variations in the resistivity of the semiconductive material near the top surface of the wafer along directions parallel to that surface, as described by A. M. Goodman in U.S. Pat. No. 4,396,438 issued 2 Aug. 1983, entitled METHOD OF MAKING CCD IMAGERS and assigned like the present application to RCA Corporation.)

The standard thick-oxide p-MOS process followed, using boron nitride deposition at 1000° C. as the doping source for p+ diffusions. The field oxide was made as a combination of 7000 Angstroms thick SiO$_2$ stream grown at 1100° C. overlaid by 5000 Angstroms thick deposited SiO$_2$. The next sequence of process steps comprised thermally growing approximately 1000 Angstroms thick channel oxide, polysilicon film deposition by pyrolytic decomposition of silane in an inert atmosphere, and selective etching to form the polysilicon gate electrodes. The polysilicon gates were insulated by a thermally grown oxide, of 2000 Angstroms thickness, with the channel oxide for the aluminum gates being simultaneously grown to 2400 Angstroms thickness. The imager structure was completed by opening contacts to the p+ diffusions and to the polysilicon gates and depositing about 10,000 Angstroms thick aluminum, etched thereafter to define the aluminum gates and device interconnections.

The presence of the drift field in substrate 10 causes the charge packets accumulated in the depletion regions to be primarily constituted of charge carriers generated in the depletion regions themselves, so the charge carriers generated in the bulk are but a small fraction of these packets. This reduces the CCD imager sensitivity somewhat. But this phenomenon also allows one to control the sensitivity of the CCD imager to different portions of the visible light spectrum by changing the depths of the depletion regions. This, owing to the fact that light on the red end of the spectrum penetrates more deeply into the conventional doped silicon semiconductor substrate than does light on the blue end of the spectrum.

In an imager with semiconductor substrate illuminated on the surface that bears electrodes—i.e., with "front-side" illumination—the shallowest depletion regions can be made primarily blue responsive. The deepest depletion regions can be made to have full visible-light spectral response; and intermediate-depth depletion regions can be made primarily green and blue responsive. (That is, using the conventional R, G, and B designations for red, green and blue primary color signals) the responses of the charge packets accumulated during imaging intervals in the three types of depletion regions can be characterized as being generally B, R+G+B and G+B in nature. The B, R+G+B and G+B signals formed responsive to successive sampling of these charge packets can be separated, by matrixing, into R, G, and B signals. Such signals are those normally required by colorplexer apparatus for creating a composite television signal, for example.

In an imager with semiconductor substrate illuminated on the opposite surface—i.e., with "back-side illumination"—the deepest depletion regions can be made responsive to the full visible light spectrum; the shallowest depletion regions, primarily red responsive; and the intermediate-depth regions, primarily green and red responsive.

One can introduce various patterns of depletion region depth variations into the semiconductor substrate of a CCD imager to cause it to supply output video samples differing in color response in a prescribed sequence. For example, the depths of the depletion regions in each column of the image register in a vertical field transfer type of CCD imager may vary cyclically in a pattern recurring every three successive cyclic groups of electrodes. Or the depths of the depletion regions may vary each third column in such type of imager. Or in a horizontal line transfer type of imager one may use similar patterns, except oriented respective to the rows, rather than the columns of the imager. These sequences of video samples with differing color responses can be separated by a time-division-multiplex de-multiplexer clocked in synchronism with the CCD imager per se to provide sequences of video samples with similar color responses, much as is done with CCD imagers used in conjunction with optical color filters.

The differences in the depths of the depletion regions can be achieved by differences in the amplitude of clock pulses applied to the gate electrodes inducing the different-depth depletion regions. This involves quite a degree of complexity in generating clock voltages, particularly where only one CCD imager is used to develop various color response video samples. The differences can be achieved by differences in the gradients of doping concentration normal to top surface 11 in the various depletion regions, since the drift field interacts with the electric field induced by gate electrodes receiving high clock voltages to tend to reduce depletion region depth. But this effect is not too pronounced, so variations in gradients of doping concentration tend to be involved that are larger than are easy to realize practically. The simplest way to vary the depths of the depletion region is to vary the absolute level of concentration from which concentration gradient is calculated according to desired depth. The range of absolute levels of doping concentration required for providing the three desired spectral responses is that associated with about two orders of magnitude difference in sheet resistivity. Shallow depletion regions could be a 1 ohm-centimeter material and deep ones of 100 ohm-centimeter material, with intermediate depth regions of 10 ohm-centimeter material, for example. The techniques above may be used together in various combinations. The doping of the dielectric layer 12 is possible to affect depletion region depth, although this technology has not been developed far enough at this time to obtain depletion region depths that stay constant over protracted periods of time.

The FIG. 3 color camera includes an example of the form the matrixing 20 may take to convert the B, R+G+B and G+B signals to R, G and B format. This matrixing 20 comprises differential-input amplifiers 21, 22, and 23 supplying R, G, and B signals from their respective output connections to colorplexer 24. Colorplexer 24 responds to its R, G, and B inputs to supply a composite color signal (e.g., according to NTSC or PAL standards) as output. Streams of R+G+B, G+B, and B image samples are supplied from a CCD imager 25 with a patterned drift field in its image register. (E.g., CCD imager 25 may have vertical columns of cyclically varying depletion region depth in its image register.) These samples are converted to continuous R+G+B, G+B, and B signals by sample-and-hold circuits 26, 27, and 28. Their cyclic sampling can be controlled by the same $\phi_{C1}$, $\phi_{C2}$, $\phi_{C3}$ clock phases supplied to the output register of CCD imager 25 by clock-signal generator 29, assuming the register to have three-phase clocking. The $\phi_{A1}$, $\phi_{A2}$, and $\phi_{A3}$ clock phases applied to the image register of CCD imager 25 have their voltage amplitude regulated with sufficient care that the depths of the potential wells induced in the charge transfer channels of CCD imager 25 image register are maintained in desired proportion for obtaining R+G+B, G+B and B video samples from the output of CCD imager 25. The $\phi_{B1}$, $\phi_{B2}$, and $\phi_{B3}$ clock phases are for the transfer register used to transport samples from the image register to the output register in CCD imager 25.

Amplifier 21 provides R signal output to colorplexer 24 responsive to the differential-mode components of the R+G+B and G+B signals supplied its non-inverting and inverting input connections from sample-and-hold circuit 26 and from sample-and-hold circuit 27, respectively. Amplifier 22 provides B signal output to colorplexer 24 responsive to the differential-mode components of G+B and B signals supplied its non-inverting and inverting input connections from sample-and-hold circuit 27 and from sample-and-hold circuit 28, respectively. Amplifier 23 provides B output signal responsive to B input signal supplied to its non-inverting input connection from sample-and-hold circuitry 28, its inverting connection being at signal ground.

FIG. 4 shows a color camera alternative to that of FIG. 3. In the FIG. 3 camera beam splitter optics 30 supply portions of an image to three CCD imager chips 25A, 25B, and 25C constructed with relatively deep, relatively shallow, and intermediate-depth depletion regions, so they supply R+G+B, B and G+B signals to matrixing 20. The beam splitter optics can be relatively inexpensive as compared to those used in many color cameras. Since color selectivity is not required of these optics, simple half-silvered mirroring techniques can be used for beam splitting. The three CCD imagers 25A, 25B, and 25C are supplied similarly phased clocking voltages, at least those supplied to the image register having well-regulated amplitudes, from clock signal generator 29'. For convenience of illustration the clocking voltages are shown collectively in broad arrow form. It may be desirable to adjust the amplitudes of the clocking voltages applied to the image, or A, registers of CCD imagers 25A, 25B, and 25C to trim the depths of the depletion regions in these registers.

FIG. 5 shows a representative structure for the CCD imager 25 of FIG. 3. The FIG. 5 imager is a vertical-field-transfer type similar to that described by P. K. Weimer in U.S. Pat. No. 4,001,878 issued 4 Jan. 1977 and entitled CHARGE TRANSFER COLOR IMAGERS (FIG. 1 of which patent substantially corresponds to FIG. 5 of this disclosure), which patent is hereby incorporated by reference into this application. Weimer describes the use of a subtractive color-stripe optical filter overlaying the image, or A, register of this CCD imager such that the color stripes register with columns of that register. The stripes are shown as being cyclically red (R), green (G) and blue (B). The FIG. 5 CCD imager dispenses with the color stripe filter. Rather, in FIG. 5 those depletion regions in the columns of the A register (as defined by flanking channel stops shown in dashed outline) underlying W's are arranged by selective doping of the imager substrate to be of relatively greatest depth, so as to collect white or W=R+G+B samples during field integration times. Those depletion regions in the columns of the A register underlying C's are arranged by selective doping of the imager substrate to be of such depth as to collect cyan or C=B+G samples during field integration times. And those depletion regions in the columns of the A register underlying B's are arranged by selective doping of the substrate to be of relatively shallow depth, so as to collect blue or B samples during field integration times.

The drift field required to force charge carriers away from the surface of the semiconductor substrate can be developed by means other than or in addition to graded concentration in the doping of the substrate. Chemical vapor deposition of non-stoichiometric oxide as dielectric layer 12 can be used to generate a drift field in the underlying substrate 10, but present technology does not provide field intensities that remain constant for terms of years. Ion implantation in the dielectric layer 12 is also a possible mechanism for generating the drift field.

The invention may, of course, be used together with other types of single-chip imager than one of vertical field transfer type. Indeed, the invention can be used in semiconductor imagers which use x-y addressing of row and column busses like a random-access memory rather than charge-coupled devices in the read-out of charge samples descriptive of elements of an image. Also, the use of a drift field in accordance with the invention in single-chip CCD imagers using subtractive color stripe optical filters is advantageous in that the better image registration provided by sweeping away minority carriers that do not migrate quickly to the closest-by depletion region suppresses the attendant cross-color.

What is claimed is:

1. A charge-coupled device comprising:
   a substrate of semiconductive material having a plane surface;
   means for introducing charge carriers into said substrate;
   a dielectric layer with one side on the plane surface of said substrate;
   a pattern of electrodes disposed on the other side of said dielectric layer for receiving potentials inducing a plurality of parallel charge transfer channels in said substrate; and
   means for producing an electric field in at least the portion of said substrate next to its said plane surface, on which field said induced parallel charge transfer channels are superimposed, which field is substantially perpendicular to said plane surface and is directed to force those charge carriers outside said parallel charge transfer channels further into the substrate.

2. A charge-coupled device as set forth in claim 1 wherein said means for introducing charge carriers into said substrate includes:
   means for projecting a radiant energy image into said substrate, responsive to which charge carriers are generated within said charge transfer channels.

3. A charge coupled device as set forth in claim 1 wherein said means for producing an electric field comprises:

a graded concentration of impurities extending into said portion of said substrate from its plane surface, for inducing a drift field for charge carriers outside the depletion regions of said parallel charge transfer channels.

4. A plurality of charge-coupled devices as set forth in claim 3 having different depths of depletion regions in their charge transfer channels for causing their spectral responses to differ;

beam splitter optics for projecting an image into their respective substrates; and color matrixing means for separating their responses into color signals.

5. A combination as set forth in claim 4 together with:

a colorplexer responding to said color signals for developing a composite color television signal.

6. An imager comprising:

charge sensing means for supplying output signal from an output thereof responsive to charges supplied to its input;

a substrate of semiconductive material having a first plane surface;

means for projecting a radiant energy image into a portion of said substrate to generate charge carriers therein proximate to said first plane surface;

a dielectric layer with one side next to the first plane surface of said substrate;

an array of electrodes disposed on the other side of said dielectric layer, overlying respective picture element sites for inducing charge collection wells;

switching means for selectively applying charge collected under selected ones of said electrodes in a predetermined pattern of succession to the input of said charge sensing means; and means for producing an electric field throughout said portion of said substrate, on which field said charge collection wells are superimposed, which field is substantially perpendicular to said first plane surface and is directed to force charge carriers generated outside said charge collection wells away from said first plane surface.

7. An imager as set forth in claim 6 wherein said means for producing an electric field comprises:

graded concentration of doping in said substrate.

8. An imager as set forth in claim 7 wherein said substrate is doped adjacent to its first plane surface in a pattern for causing the areas underlying said electrodes in said portion of the substrate to respond selectively to different wavelengths of radiant energy in said image.

9. A charge-coupled imager comprising:

charge sensing means for supplying output signal from an output thereof responsive to charges supplied to its input;

a substrate of semiconductive material having a first plane surface;

means for projecting a radiant energy image into a portion of said substrate to generate charge carriers therein proximate to said first plane surface;

means for producing an electric field in said portion of said substrate which field is substantially perpendicular to said first plane surface and is directed to force charge carriers away from said first plane surface;

a dielectric layer with one side next to the first plane surface of said substrate;

a plurality of regularly spaced parallel electrodes disposed on the other side of said dielectric layer, overlying a portion of said substrate at least coextensive with that portion of said substrate into which a radiant energy image is projected, for responding to potentials applied to them to induce a plurality of charge transfer channels in a direction perpendicular to the direction of their parallel succession, said channels being superimposed on said electric field;

a pattern of channel stops diffused into said substrate near its first plane surface for defining the bounds of those parallel charge transfer channels, the area under each electrode in one of those charge transfer channels located in the portion of said substrate into which the radiant energy image is projected identifiable with a picture element;

means for shifting charges collected in those areas, which means includes said electrodes, to appear in regular order at the input of said charge sensing means; and variations of doping in said substrate adjacent to its first plane surface in a pattern, cooperative with said electric field for conditioning those areas identifiable with picture elements to respond selectively to different wavelengths of radiant energy in said image.

10. An imager as set forth in claim 8 or 9 in combination with:

color matrixing means having an input from the output of said charge sensing means for receiving responses to said areas and having output connections, for separating the responses into color signals supplied at respective ones of its output connections.

11. A combination as set forth in claim 10 further comprising:

a colorplexer responding to said color signals for developing a composite television signal.

12. A color camera comprising:

three CCD imagers on respective semiconductor substrates, each having a respective image register with overlying electrodes on a surface thereof and with a drift field substantially perpendicular to its said surface and directed so as to tend to force charge carriers away from its said surface;

beam splitter optics for projecting an image into each of those image registers; and means for inducing depletion regions of different relative depths under the electrodes of the image registers, said regions being superimposed on said drift field, said means including means for applying clock voltages to the electrodes of each image register having suitably regulated amplitudes during image integration times thereby to condition of the first of said CCD imagers to supply as its output a first color signal, the second of said CCD imagers to supply as its output the sum of said first color signal and a second color signal, and the third of said CCD imagers to supply as its output the sum of said first and second color signals and a third color signal.

13. A color camera as set forth in claim 12 wherein said means for inducing depletion regions of different relative depths under the electrodes of the image registers of said first, second and third CCD imagers includes variations of doping in regions of their respective substrates underlying those image registers.

14. A color camera as set forth in claim 12 or 13 including:

means for differentially comparing the outputs of said first and second CCD imagers to obtain said second color signal; and means for differentially comparing the outputs of said second and third CCD imagers to obtain said third color signal.

15. A color camera as set forth in claim 14 in combination with a colorplexer receptive of said first, second and third color signals for developing a composite color signal.

16. A method for causing differences in the spectral responses of different portions of a region of a photosensitive semiconductor substrate, which regions parallels a surface of said substrate, said method comprising the steps of:

inducing charge carrier collecting depletion regions of various depths in said substrate surface, said depths differing in like amounts as the depths to which various spectral components of light penetrate into said photosensitive semiconductor, and having introduced a graded doping concentration in said semiconductor substrate normal to its surface for creating a drift field, on which field said depletion regions are superimposed, said drift field being of sufficient strength to prevent a substantial fraction of charge carriers originating outside said depletion regions from ever diffusing to any of said depletion regions.

* * * * *